(12) United States Patent
Liu et al.

(10) Patent No.: US 10,141,774 B2
(45) Date of Patent: Nov. 27, 2018

(54) CHARGING CIRCUIT AND TERMINAL FOR WIRED AND WIRELESS CHARGING

(71) Applicant: Huawei Device (Dongguan) Co., Ltd., Dongguan (CN)

(72) Inventors: Wenju Liu, Shenzhen (CN); Zhonghui Peng, Shanghai (CN); Jiangtao Yang, Shanghai (CN)

(73) Assignee: Huawei Device (Dongguan) Co., Ltd., Dongguan (CN)

( * ) Notice: Subject to any disclaimer, the term of this patent is extended or adjusted under 35 U.S.C. 154(b) by 52 days.

(21) Appl. No.: 15/123,583

(22) PCT Filed: Mar. 4, 2014

(86) PCT No.: PCT/CN2014/072867
§ 371 (c)(1),
(2) Date: Sep. 2, 2016

(87) PCT Pub. No.: WO2015/131335
PCT Pub. Date: Sep. 11, 2015

(65) Prior Publication Data
US 2017/0077743 A1    Mar. 16, 2017

(51) Int. Cl.
*H01M 10/46* (2006.01)
*H02J 7/02* (2016.01)
(Continued)

(52) U.S. Cl.
CPC ............ *H02J 7/027* (2013.01); *H02J 7/0029* (2013.01); *H02J 7/0055* (2013.01); *H02J 7/025* (2013.01);
(Continued)

(58) Field of Classification Search
CPC ...... H02J 7/0024; H02J 7/0034; H02J 7/0036; H02J 7/0052; H02J 2007/0059; H02J 7/007; H02J 7/0072
(Continued)

(56) References Cited

U.S. PATENT DOCUMENTS

2005/0141154 A1* 6/2005 Consadori ............. B60R 16/023
361/62
2006/0103355 A1 5/2006 Patino et al.
(Continued)

FOREIGN PATENT DOCUMENTS

CN    101707384 A    5/2010
CN    201478885 U    5/2010
(Continued)

*Primary Examiner* — Edward Tso

(57) ABSTRACT

The present invention disclose a charging circuit including: a first input/output end of a wired connection module is configured to connect to an output end, a second input/output end of the wired connection module connects to a first input end of a switch circuit, and the second input/output end connects to a first input/output end; a first input end of a control circuit connects to the second input/output end, and an output end connects to an enabling end of a wireless charging module; an output end connects to a second input end of the switch circuit; a first output end connects to an input/output end; a second input/output end of the shunt circuit connects to the input/output end, a third end of the shunt circuit connects to the output end; an output end of the charging management module is configured to connect to a battery.

19 Claims, 6 Drawing Sheets

(51) Int. Cl.
    *H02J 7/00*           (2006.01)
    *H02J 50/00*         (2016.01)
    *H02J 50/10*         (2016.01)
    *H02J 7/04*          (2006.01)
    *H03K 17/12*         (2006.01)

(52) U.S. Cl.
    CPC .............. *H02J 7/045* (2013.01); *H02J 50/00* (2016.02); *H02J 50/10* (2016.02); *H02J 7/0036* (2013.01); *H02J 2007/0062* (2013.01); *H03K 17/122* (2013.01)

(58) Field of Classification Search
    USPC .......................... 320/132, 137, 149, 161–164
    See application file for complete search history.

(56) References Cited

U.S. PATENT DOCUMENTS

| | | | |
|---|---|---|---|
| 2009/0139781 A1* | 6/2009 | Straubel | B60L 11/1875 180/65.1 |
| 2012/0139487 A1 | 6/2012 | Kim et al. | |
| 2012/0161697 A1* | 6/2012 | Park | G06F 1/263 320/108 |
| 2012/0280648 A1 | 11/2012 | Hwang et al. | |
| 2013/0278207 A1* | 10/2013 | Yoo | H02J 7/025 320/108 |
| 2013/0334883 A1* | 12/2013 | Kim | H02J 7/34 307/29 |
| 2014/0300312 A1 | 10/2014 | Akiyoshi et al. | |
| 2014/0320081 A1 | 10/2014 | Kim et al. | |

FOREIGN PATENT DOCUMENTS

| | | |
|---|---|---|
| CN | 102593883 A | 7/2012 |
| CN | 103002158 A | 3/2013 |
| CN | 103296705 A | 9/2013 |
| CN | 103378639 A | 10/2013 |
| CN | 103384952 A | 11/2013 |
| CN | 103516014 A | 1/2014 |
| CN | 103545881 A | 1/2014 |
| JP | 2003134699 A | 5/2003 |
| JP | 2005328658 A | 11/2005 |
| JP | 2007336710 A | 12/2007 |
| JP | 2012125130 A | 6/2012 |
| JP | 2013150533 A | 8/2013 |
| WO | 0131790 A1 | 5/2001 |
| WO | 2013/094469 A1 | 6/2013 |

\* cited by examiner

CHARGING CIRCUIT AND TERMINAL FOR WIRED AND WIRELESS CHARGING

CROSS REFERENCE TO RELATED APPLICATIONS

The present application claims priority under 35 U.S.C. § 365 to International Patent Application No. PCT/CN2014/072867 filed Mar. 4, 2014 which is incorporated herein by reference into the present disclosure as if fully set forth herein.

TECHNICAL FIELD

The present invention relates to the electronics field, and in particular, to a charging circuit and a terminal.

BACKGROUND

With development of electronic technologies, wireless charging technologies begin to be gradually applied to a terminal that includes a battery, such as a cell phone, a tablet computer, or a remote control device. Because in a wireless charging process, a terminal does not need to connect to a power supply by using a wired connection, a user may use the terminal in a place that is relatively far from the power supply. However, some users are used to wired charging and some users are used to wireless charging, or a current of a charging signal during wireless charging is extremely low, thereby causing a relatively long battery charging time. For these reasons, terminal manufacturers usually want to configure two manners for a terminal: wired charging and wireless charging. However, how to integrate wired charging technologies and wireless charging technologies on the terminal is a problem that needs to be resolved urgently by the terminal manufacturers.

SUMMARY

Embodiments of the present invention provide a charging circuit and a terminal, so that wired charging technologies and wireless charging technologies can be integrated on the terminal.

According to a first aspect, the present invention provides a charging circuit, including: a wired connection module, a wireless charging module, a switch circuit, a control circuit, a shunt circuit, and a charging management module, where:

a first input/output end of the wired connection module is configured to connect to an output end of a wired charger, a second input/output end of the wired connection module connects to a first input end of the switch circuit, and the second input/output end of the wired connection module further connects to a first input/output end of the shunt circuit;

a first input/output end of the control circuit connects to the second input/output end of the wired connection module, and a second input/output end of the control circuit connects to an enabling end of the wireless charging module;

an output end of the wireless charging module connects to a second input end of the switch circuit;

a first output end of the switch circuit connects to an input/output end of the charging management module;

a second input/output end of the shunt circuit connects to the input/output end of the charging management module, and a third end of the shunt circuit connects to the output end of the wireless charging module; and an output end of the charging management module is configured to connect to a battery.

With reference to the first aspect, in a first possible implementation manner, the wired connection module is configured to receive a first charging signal output by the wired charger, where the first charging signal charges the battery after passing through the second input/output end of the wired connection module, the first input end of the switch circuit, the first output end of the switch circuit, an input end of the charging management module, and the output end of the charging management module; when the third end of the shunt circuit does not receive a second charging signal output by the output end of the wireless charging module, the first input/output end of the shunt circuit and the second input/output end of the shunt circuit are conducted, so that the first charging signal charges the battery after passing through the second input/output end of the wired connection module, the first input/output end of the shunt circuit, the second input/output end of the shunt circuit, the input end of the charging management module, and the output end of the charging management module; and the first charging signal is further transmitted to the first input end of the control circuit by using the second input/output end of the wired connection module, and when the first input end of the control circuit receives the first charging signal, the output end of the control circuit outputs a high level signal, the high level signal is transmitted to the enabling end of the wireless charging module, the enabling end of the wireless charging module receives the high level signal, and the output end of the wireless charging module does not output a signal; or the wireless charging module is configured to receive a second charging signal output by a wireless charger, where the enabling end of the wireless charging module receives a low level signal, and the second charging signal charges the battery after passing through the output end of the wireless charging module, the second input end of the switch circuit, the first output end of the switch circuit, an input end of the charging management module, and the output end of the charging management module.

With reference to the first aspect, or the first possible implementation manner of the first aspect, in a second possible implementation manner, that a third end of the shunt circuit connects to the output end of the wireless charging module is specifically that the third end of the shunt circuit connects to the output end of the wireless charging module by using a protection circuit.

With reference to the first aspect, the first possible implementation manner of the first aspect, or the second possible implementation manner of the first aspect, in a third possible implementation manner, the shunt circuit includes: at least one group of P-type MOS transistors, where:

each group of P-type MOS transistors includes a first P-type MOS transistor and a second P-type MOS transistor, where a drain electrode of the first P-type MOS transistor connects to the second input/output end of the wired connection module, a source electrode of the first P-type MOS transistor connects to a source electrode of the second P-type MOS transistor, a drain electrode of the second P-type MOS transistor connects to the input/output end of the charging management module, a gate electrode of the first P-type MOS transistor connects to a gate electrode of the second P-type MOS transistor, and the gate electrode of the first P-type MOS transistor connects to the output end of the wireless charging module by using the protection circuit; or each group of P-type MOS transistors includes a first P-type MOS transistor and a second P-type MOS transistor, where a source electrode of the first P-type MOS transistor connects to the second input/output end of the wired connection module, a drain electrode of the first P-type MOS transistor connects to a drain electrode of the second P-type MOS transistor, a source electrode of the second P-type MOS transistor connects to the input/output end of the charging management module, a gate electrode of the first P-type MOS transistor connects to a gate electrode of the second P-type MOS transistor, and the gate electrode of the first P-type MOS transistor connects to the output end of the wireless charging module by using the protection circuit.

With reference to any one of the foregoing implementation manners of the first aspect, in a fourth possible implementation manner, the control circuit includes: a resistor R3, a resistor R4, a resistor R5, and a first N-type MOS transistor, where:

one end of the resistor R3 connects to the second input/output end of the wired connection module, and the other end of the resistor R3 connects to a gate electrode of the first N-type MOS transistor and one end of the resistor R4; the one end of the resistor R4 connects to the gate electrode of the first N-type MOS transistor, and the other end of the resistor R4 is grounded; and a drain electrode of the first N-type MOS transistor is configured to connect to a stable potential, a source electrode of the first N-type MOS transistor connects to the enabling end of the wireless charging module, and the source electrode of the first N-type MOS transistor is further grounded by using the resistor R5.

With reference to any one of the foregoing implementation manners of the first aspect, in a fifth possible implementation manner, the circuit further includes a controller, and the enabling end of the wireless charging module further connects to a first input/output end of the controller;

the first input/output end of the wired connection module is further configured to connect to an external device;

the controller is configured to: when the first input/output end of the wired connection module connects to the external device, output a high level signal to the enabling end of the wireless charging module, where the output end of the wireless charging module does not output a signal when the enabling end of the wireless charging module receives the high level signal; and the controller is further configured to control the charging management module, where a current output by the charging management module supplies power to the external device after passing through the second input/output end of the shunt circuit, the first input/output end of the shunt circuit, the second input/output end of the wired connection module, and the first input/output end of the wired connection module.

With reference to the fifth possible implementation manner of the first aspect, in a sixth possible implementation manner, the circuit further includes a display signal transmission circuit and a display screen, where an input end of the display signal transmission circuit connects to a second output end of the switch circuit, an output end of the display signal transmission circuit connects to a second input/output end of the controller, and an input end of the display screen connects to a third input/output end of the controller, where:

the switch circuit is further configured to: when the switch circuit receives the first charging signal, output a high level signal by using the second output end of the switch circuit, when the input end of the display signal transmission circuit receives the high level signal, the display signal transmission circuit outputs a low level signal to the controller, the controller is further configured to output a first display instruction to the display screen according to the low level signal transmitted by the display signal transmission circuit, and the display screen is configured to display a first display message according to the first display instruction, where the first display message is used to indicate that wired charging is currently performed on the battery; and the switch circuit is further configured to: when the switch circuit receives the second charging signal, output a low level signal by using the second output end of the switch circuit, when the input end of the display signal transmission circuit receives the low level signal, the display signal transmission circuit outputs a high level signal to the controller, the controller is further configured to output a second display instruction to the display screen according to the high level signal transmitted by the display signal transmission circuit, and the display screen is configured to display a second display message according to the second display instruction, where the second display message is used to indicate that wireless charging is currently performed on the battery; or the switch circuit is further configured to: when the switch circuit receives the first charging signal, output a low level signal by using the second output end of the switch circuit, when the input end of the display signal transmission circuit receives the low level signal, the display signal transmission circuit outputs a high level signal to the controller, the controller is further configured to output a first display instruction to the display screen according to the high level signal transmitted by the display signal transmission circuit, and the display screen is configured to display a first display message according to the first display instruction, where the first display message is used to indicate that wired charging is currently performed on the battery; and the switch circuit is further configured to: when the switch circuit receives the second charging signal, output a high level signal by using the second output end of the switch circuit, when the input end of the display signal transmission circuit receives the high level signal, the display signal transmission circuit outputs a low level signal to the controller, the controller is further configured to output a second display instruction to the display screen according to the low level signal transmitted by the display signal transmission circuit, and the display screen is configured to display a second display message according to the second display instruction, where the second display message is used to indicate that wireless charging is currently performed on the battery.

With reference to the third possible implementation manner of the first aspect, in a seventh possible implementation manner, the protection circuit includes: a resistor R1, a resistor R2, and a capacitor C1, where the resistor R1 is serially connected between the gate electrode of the first P-type MOS transistor and the output end of the wireless charging module, the capacitor C1 is serially connected between the gate electrode of the first P-type MOS transistor and ground, and the resistor R2 is serially connected between the output end of the wireless charging module and the ground.

With reference to the sixth possible implementation manner of the first aspect, in an eighth possible implementation manner, the display signal transmission circuit includes: a resistor R6, a resistor R7, and a second N-type MOS transistor, where:

a gate electrode of the second N-type MOS transistor connects to the second output end of the switch circuit, the gate electrode of the second N-type MOS transistor is further grounded by using the resistor R7, a drain electrode of the second N-type MOS transistor connects to the second input/output end of the controller, the drain electrode of the second N-type MOS transistor further connects to a stable potential by using the resistor R6, and a source electrode of the second N-type MOS transistor is grounded.

With reference to any one of the foregoing implementation manners of the first aspect, in a ninth possible implementation manner, the circuit further includes: a first electrostatic protection circuit, where the first electrostatic protection circuit includes: a capacitor C2, a capacitor C3, and an electrostatic protection diode D1, where:

one end of the capacitor C2 connects to the output end of the wireless charging module, and the other end of the capacitor C2 is grounded; one end of the capacitor C3 connects to the output end of the wireless charging module, and the other end of the capacitor C3 is grounded; and one end of the electrostatic protection diode D1 connects to the output end of the wireless charging module, and the other end of the electrostatic protection diode D1 is grounded.

With reference to any one of the foregoing implementation manners of the first aspect, in a tenth possible implementation manner, the circuit further includes: a second electrostatic protection circuit, where the second electrostatic protection circuit includes: an electrostatic protection diode D2, where:

one end of the electrostatic protection diode D2 connects to the enabling end of the wireless charging module and the first input/output end of the controller, and the other end of the electrostatic protection diode D2 is grounded.

According to a second aspect, an embodiment of the present invention further provides a terminal, including the charging circuit of any implementation manner provided in the first aspect.

In the foregoing technical solutions, a first input/output end of a wired connection module is configured to connect to an output end of a wired charger, a second input/output end of the wired connection module connects to a first input end of a switch circuit, and the second input/output end further connects to a first input/output end of a shunt circuit; a first input end of a control circuit connects to the second input/output end of the wired connection module, and an output end of the control circuit connects to an enabling end of a wireless charging module; an output end of the wireless charging module connects to a second input end of the switch circuit; a first output end of the switch circuit connects to an input/output end of a charging management module; a second input/output end of the shunt circuit connects to the input/output end of the charging management module, and a third end of the shunt circuit connects to the output end of the wireless charging module; and an output end of the charging management module is configured to connect to a battery. In this way, the foregoing circuit can implement wired charging and wireless charging for a terminal battery, thereby resolving a problem about how to integrate wired charging technologies and wireless charging technologies on a terminal.

BRIEF DESCRIPTION OF THE DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

In the embodiments of the present invention, a charging circuit may be applied to any terminal that includes a battery, such as a cell phone, a tablet computer, an e-reader, a remote control, a notebook computer, an in-vehicle device, or a wearable device.

Figure 1:
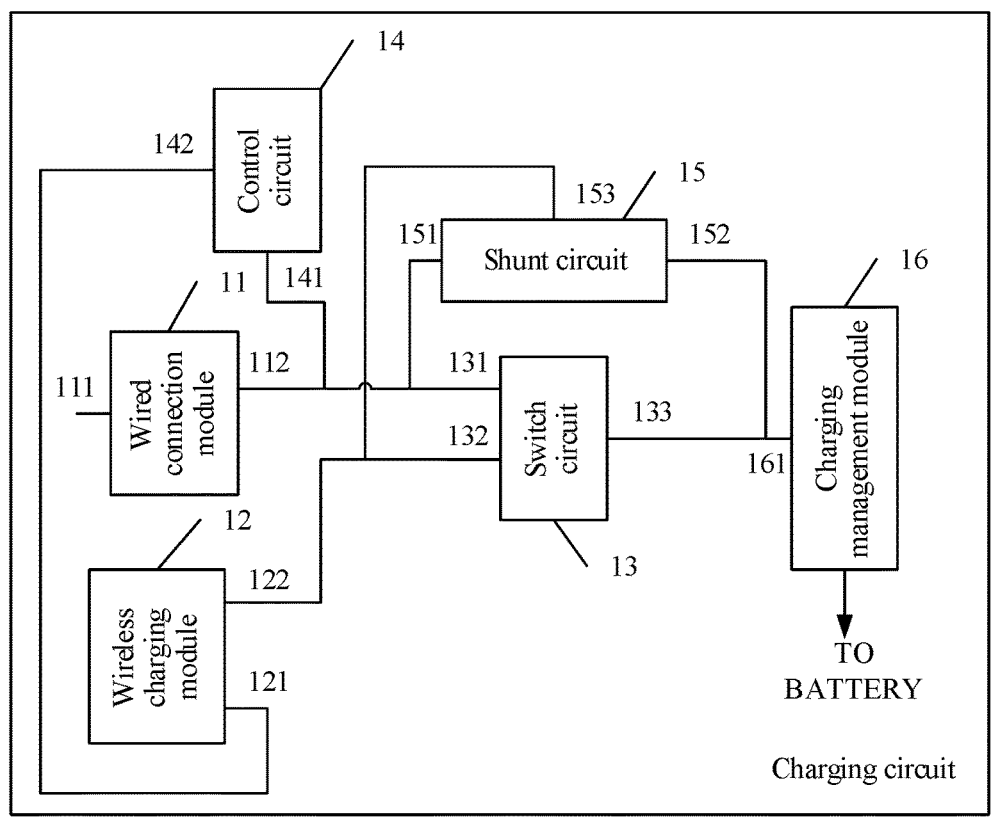
FIG. 1 is a schematic structural diagram of a charging circuit according to an embodiment of the present invention.

Referring to FIG. 1, FIG. 1 is a schematic structural diagram of a charging circuit according to an embodiment of the present invention. As shown in FIG. 1, the charging circuit includes: a wired connection module 11, a wireless charging module 12, a switch circuit 13, a control circuit 14, a shunt circuit 15, and a charging management module 16, where:

a first input/output end 111 of the wired connection module 11 is configured to connect to an output end of a wired charger, a second input/output end 112 of the wired connection module 11 connects to a first input end 131 of the switch circuit 13, and the second input/output end 112 of the wired connection module 11 further connects to a first input/output end 151 of the shunt circuit 15;

a first input end 141 of the control circuit 14 connects to the second input/output end 112 of the wired connection module 11, and an output end 142 of the control circuit 14 connects to an enabling end 121 of the wireless charging module 12;

an output end 122 of the wireless charging module 12 connects to a second input end 132 of the switch circuit 13;

a first output end 133 of the switch circuit 13 connects to an input/output end 161 of the charging management module 16;

a second input/output end 152 of the shunt circuit 15 connects to the input/output end 161 of the charging management module 16, and a third end 153 of the shunt circuit 15 connects to the output end 122 of the wireless charging module 12; and an output end of the charging management module 16 is configured to connect to a battery.

It can be learned from the foregoing that, the charging circuit provided in this embodiment of the present invention may implement wired charging and wireless charging for a terminal battery, thereby resolving a problem about how to integrate wired charging technologies and wireless charging technologies on a terminal.

Optionally, an impedance of the shunt circuit 15 may be less than an impedance of the switch circuit 13, so that an impedance generated after the shunt circuit 15 and the switch circuit 13 are connected in parallel becomes smaller, and a high current can be used to charge the battery.

Optionally, the wired connection module 11 may be a USB interface.

Optionally, the charging management module 16 may be a charging management chip.

The wired connection module 11 may be configured to receive a first charging signal output by the wired charger, so that the first charging signal can charge the battery after passing through the second input/output end 112 of the wired connection module 11, the first input end 131 of the switch circuit 13, the first output end 133 of the switch circuit 13, the input/output end 161 of the charging management module 16, and the output end of the charging management module 16. In addition, when the third end 153 of the shunt circuit 15 does not receive a second charging signal output by the output end 122 of the wireless charging module 12, the first input/output end 151 of the shunt circuit 15 and the second input/output end 152 of the shunt circuit 15 are conducted, so that the first charging signal can further charge the battery after passing through the second input/output end 112 of the wired connection module 11, the first input/output end 151 of the shunt circuit 15, the second input/output end 152 of the shunt circuit 15, the input/output end 161 of the charging management module 16, and the output end of the charging management module 16. In addition, the first charging signal further flows into the first input end 141 of the control circuit 14 after passing through the second input/output end 112 of the wired connection module 11; when the first input end 141 of the control circuit 14 receives the first charging signal, the output end 142 of the control circuit 14 can output a high level signal, where the high level signal can flow into the enabling end 121 of the wireless charging module 12; and when the enabling end 121 of the wireless charging module 12 receives the high level signal, the output end 122 of the wireless charging module 12 does not output a signal. Therefore, it may be implemented that, when the first charging signal charges the battery, the output end 122 of the wireless charging module 12 does not output a signal, thereby implementing that the wired charger charges the battery.

Figure 2:
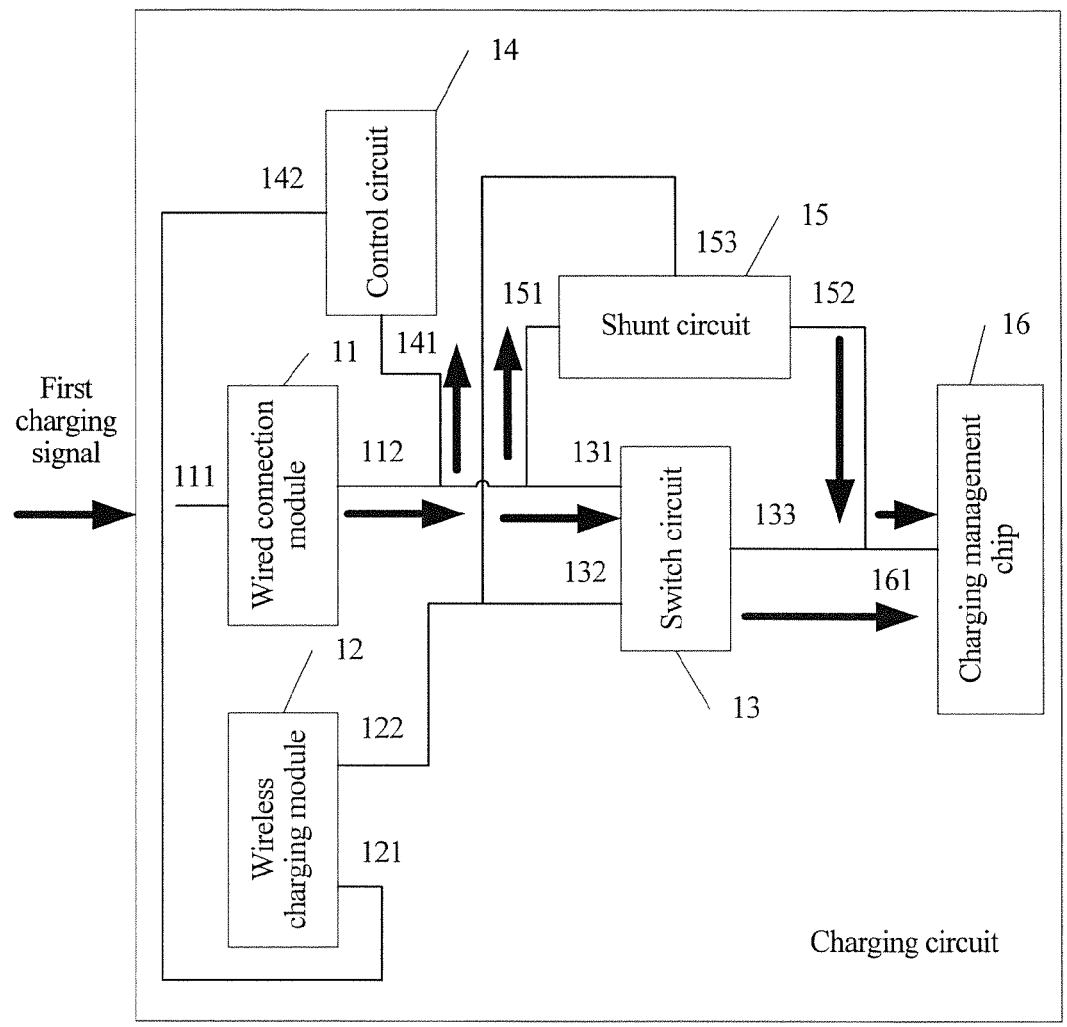
FIG. 2 and FIG. 3 are respectively schematic diagrams of charging signal flow directions of wired charging and wireless charging.

When the wired charger charges the battery, reference may be made to a flow direction of the first charging signal shown in FIG. 2 for the flow direction of the first charging signal.

Optionally, the wireless charging module 12 may be configured to receive a second charging signal output by a wireless charger; when the enabling end 121 of the wireless charging module 12 receives a low level signal, the second charging signal may implement wireless charging for the battery after passing through the output end 122 of the wireless charging module 12, the second input end 132 of the switch circuit 13, the first output end 133 of the switch circuit 13, the input/output end 161 of the charging management module 16, and the output end of the charging management module 16.

Figure 3:
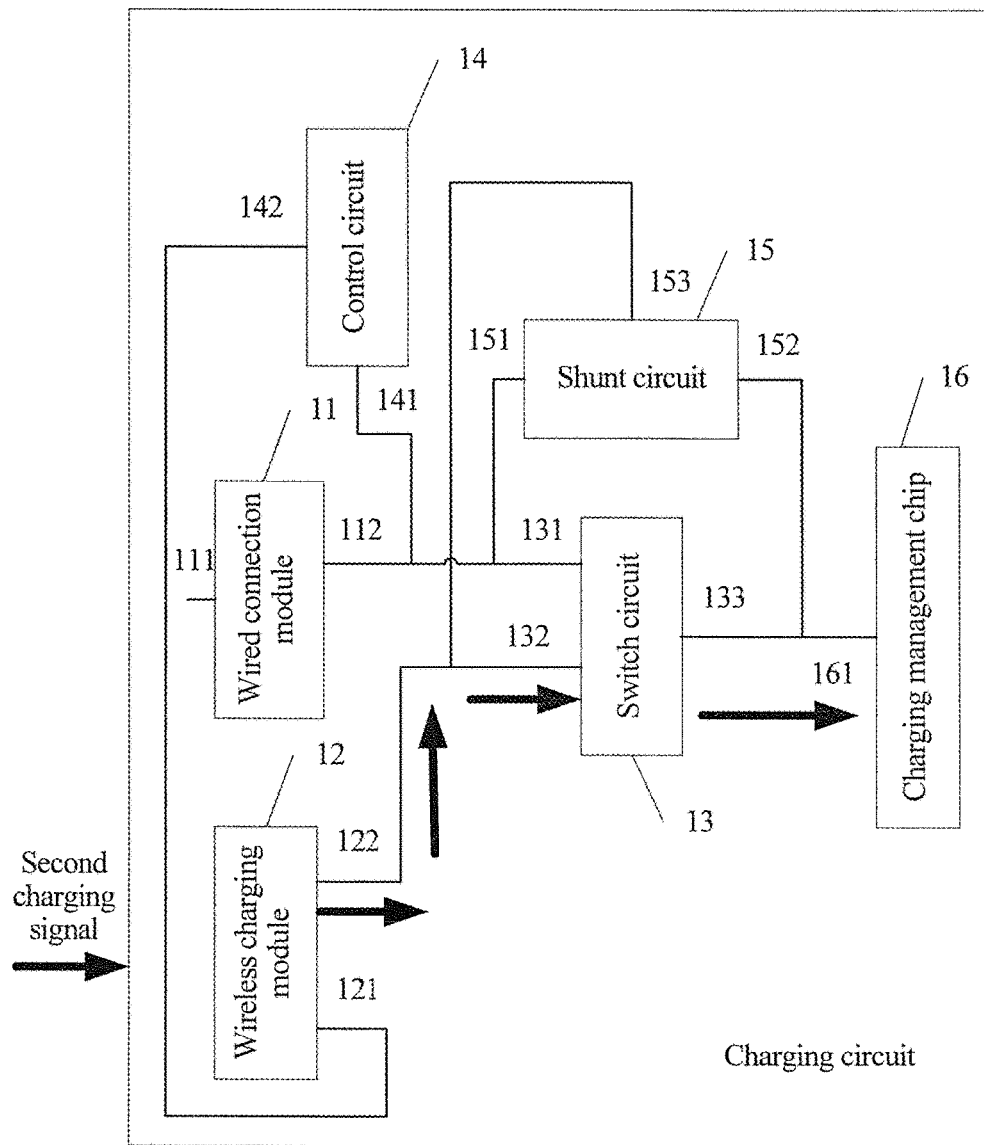

During wireless charging, reference may be made to a flow direction of the second charging signal shown in FIG. 3 for the flow direction of the second charging signal.

Optionally, the enabling end 121 of the wireless charging module 12 may be a constant low-level port, that is, when the enabling end 121 of the wireless charging module 12 does not receive a high level signal, the enabling end 121 remains in a low level state always.

Optionally, a voltage dynamic power management (Voltage Dynamic Power Management, VDPM) threshold may exist in the charging management module 16, where the VDPM threshold may be preset to a lowest voltage limit value in the charging management module 16, and a function of the VDPM threshold is as follows: When a voltage of a charging signal is lower than the threshold, the charging management module 16 lowers a current of the charging signal, so as to avoid a case in which when a voltage of a charging signal is relatively low, a charging current is extremely low, thereby causing an overlong charging time.

In the foregoing circuit, the second input/output end 112 of the wired connection module 11 connects to the first input end 131 of the switch circuit 13, the second input/output end 112 of the wired connection module 11 further connects to the first input/output end 151 of the shunt circuit 15, the first output end 133 of the switch circuit 13 connects to the input/output end 161 of the charging management module 16, and the second input/output end 152 of the shunt circuit 15 connects to the input/output end 161 of the charging management module 16. In this way, the shunt circuit 15 connects in parallel to the switch circuit 13, that is, the shunt circuit 15 and the switch circuit 13 are connected in parallel between the second input/output end 112 of the wired connection module 11 and the input/output end 161 of the charging management module 16. In addition, an impedance generated when the shunt circuit 15 and the switch circuit 13 are connected in parallel is less than the impedance of the shunt circuit 15, and the impedance generated when the shunt circuit 15 and the switch circuit 13 are connected in parallel is less than the impedance of the switch circuit 13. That is, after the shunt circuit 15 and the switch circuit 13 are connected in parallel, an impedance between the second input/output end 112 of the wired connection module 11 and the input/output end 161 of the charging management module 16 is relatively small, thereby causing a relatively small voltage step-down generated when the first charging signal flows into the input/output end 161 of the charging management module 16. When the wired charger uses a high current (for example, a current greater than or equal to 1 ampere) to charge the battery, there is a relatively small voltage step-down on a path along which the first charging signal is transmitted to the charging management module 16. Therefore, the first charging signal does not reach the VDPM threshold of the charging circuit, thereby implementing that a high current is used to charge the battery, so as to increase a charging speed of the battery.

Optionally, in this embodiment, the charging management module 16 is not limited, for example, the charging management module 16 may be a charging management module in a cell phone or a tablet computer.

Optionally, the wireless charging module 12 may receive the second charging signal transmitted by the wireless charger, or receive an electromagnetic wave signal transmitted by the wireless charger. For example, when the wireless charger is operating, a terminal in which the charging circuit is located is disposed above the wireless charger, so that the wireless charging module 12 can receive the electromagnetic wave signal transmitted by the wireless charger. It should be noted that, when the terminal in which the charging circuit is located is disposed above the wireless discharger, the battery is charged in an electromagnetic induction manner.

Figure 4:
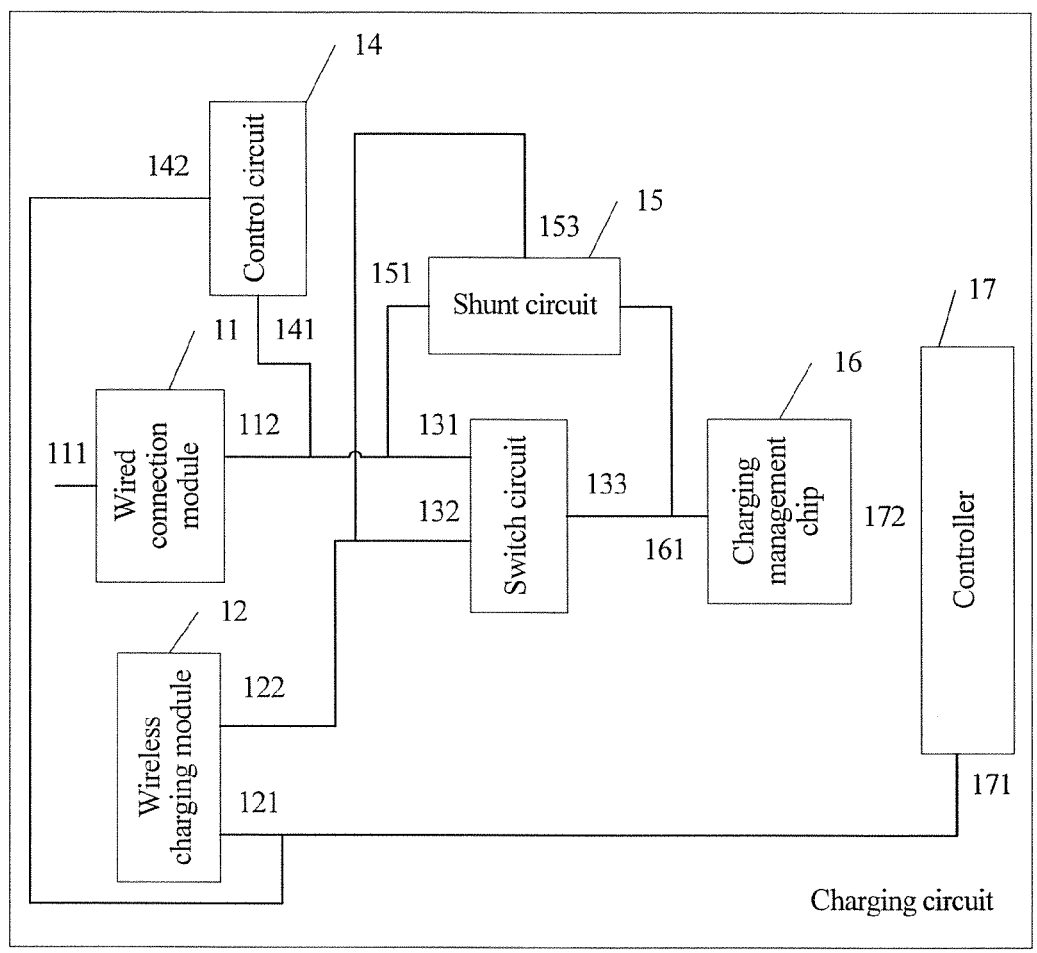
FIG. 4 is a schematic structural diagram of another charging circuit according to an embodiment of the present invention.

Optionally, as shown in FIG. 4, the circuit may further include a controller 17, where:

the enabling end 121 of the wireless charging module 12 further connects to a first input/output end 171 of the controller 17; and the first input/output end 111 of the wired connection module 11 may further connect to an external device.

Figure 6:
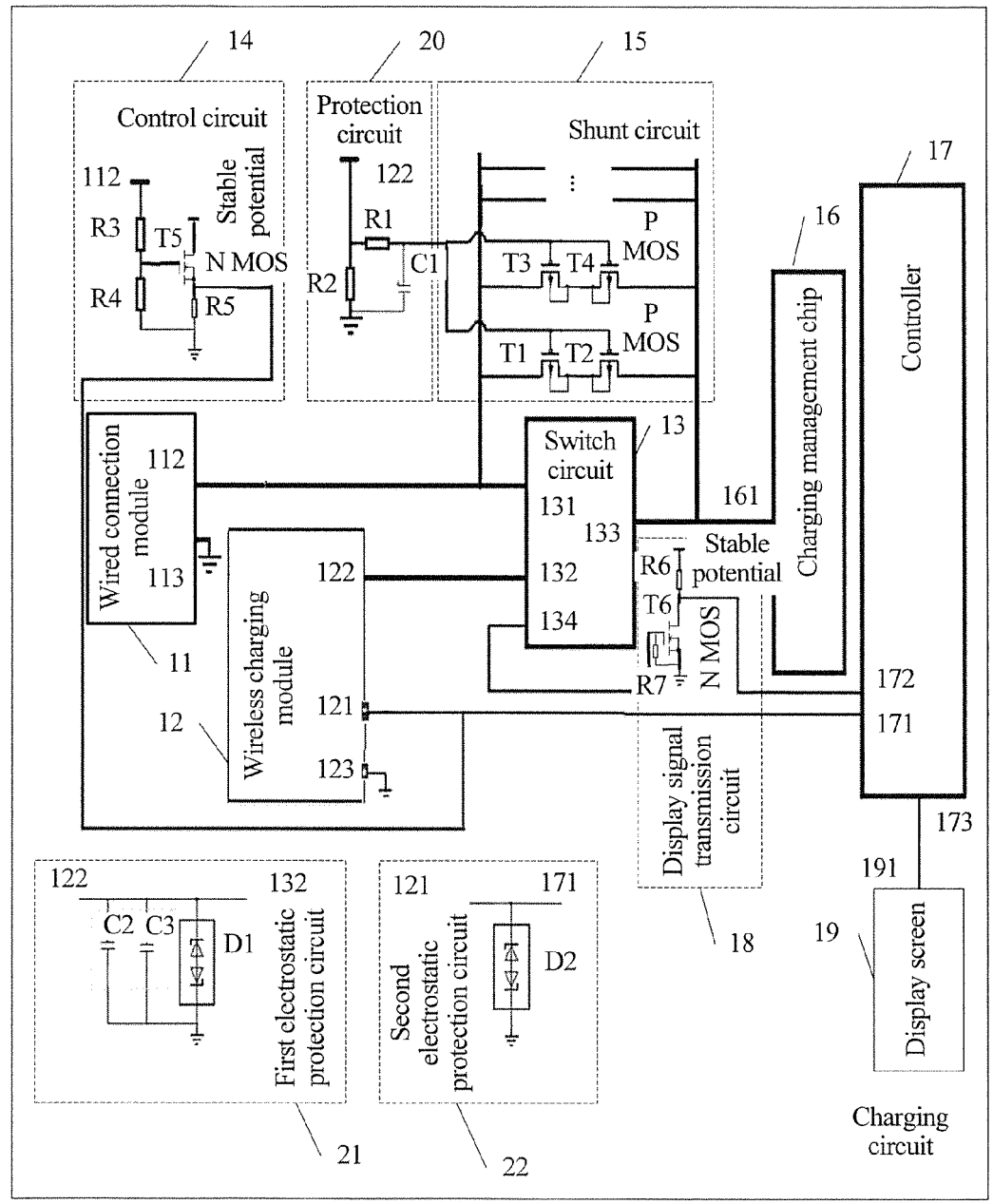
FIG. 6 is a schematic structural diagram of another charging circuit according to an embodiment of the present invention.

Referring to FIG. 6, that a third end 153 of the shunt circuit 15 connects to the output end 122 of the wireless charging module 12 may be specifically: the third end 153 of the shunt circuit 15 connects to the output end 122 of the wireless charging module 12 by using a protection circuit 20.

Optionally, the controller 17 may be configured to: when the first input/output end 111 of the wired connection module 11 connects to the external device, that is, when the controller 17 detects that the first input/output end 111 of the wired connection module 11 connects to the external device (for example, the controller 17 may receive, by using an id interface of the wired connection module, a signal indicating that the external device is inserted), the controller 17 may output a high level signal to the enabling end 121 of the wireless charging module 12, so as to control the output end 122 of the wireless charging module 12 not to output a signal, that is, to disable wireless charging. The output end 122 of the wireless charging module 12 sends a low level signal to the protection circuit 20, so as to ensure that the shunt circuit 15 keeps closed. The controller 17 may (for example, by using an I2C bus) control the output end 122 of the wireless charging module 12 to send a low level signal to the protection circuit 20, so as to ensure that the shunt circuit 15 keeps closed. The controller 17 may (for example, by using an I2C bus) control the charging management module 16, so that a current output by the charging management module 16 can supply power to the external device after passing through the second input/output end 152 of the shunt circuit 15, the first input/output end 151 of the shunt circuit 15, the second input/output end 112 of the wired connection module 11, and the first input/output end 111 of the wired connection module 11.

Because the terminal to which the foregoing charging circuit belongs performs an electrical signal (for example, a current signal) transmission with the external device, host devices such as a computer do not need to participate in a signal transmission process, thereby implementing an OTG (On The Go) function. The OTG function refers to a technology implementing signal transmission between devices without a host (Host). For example, when the foregoing charging circuit is a charging circuit in a cell phone, the cell phone uses the OTG technology to charge the external device by using the foregoing charging circuit, without needing to use a computer. The external device may be a terminal that includes a battery, such as a cell phone, a tablet computer, an e-reader, a remote control, a notebook computer, an in-vehicle device, or a wearable device that can implement OTG (On The Go).

Optionally, when the first input/output end 111 of the wired connection module 11 connects to the external device, the controller 17 outputs a high level signal to the enabling end 121 of the wireless charging module 12; when the enabling end 121 of the wireless charging module 12 receives a high level signal, a second input/output end of the wireless charging module 12 is forbidden to output a signal. Therefore, it may be implemented that, when electrical signal transmission is performed with the external device, wireless charging is forbidden, so as to avoid causing a collision between an electrical signal and a second charging signal.

Optionally, the controller 17 may be a terminal system chip, that is, an AP (application processor) chip, such as a cell phone system chip or a tablet computer system chip.

Figure 5:
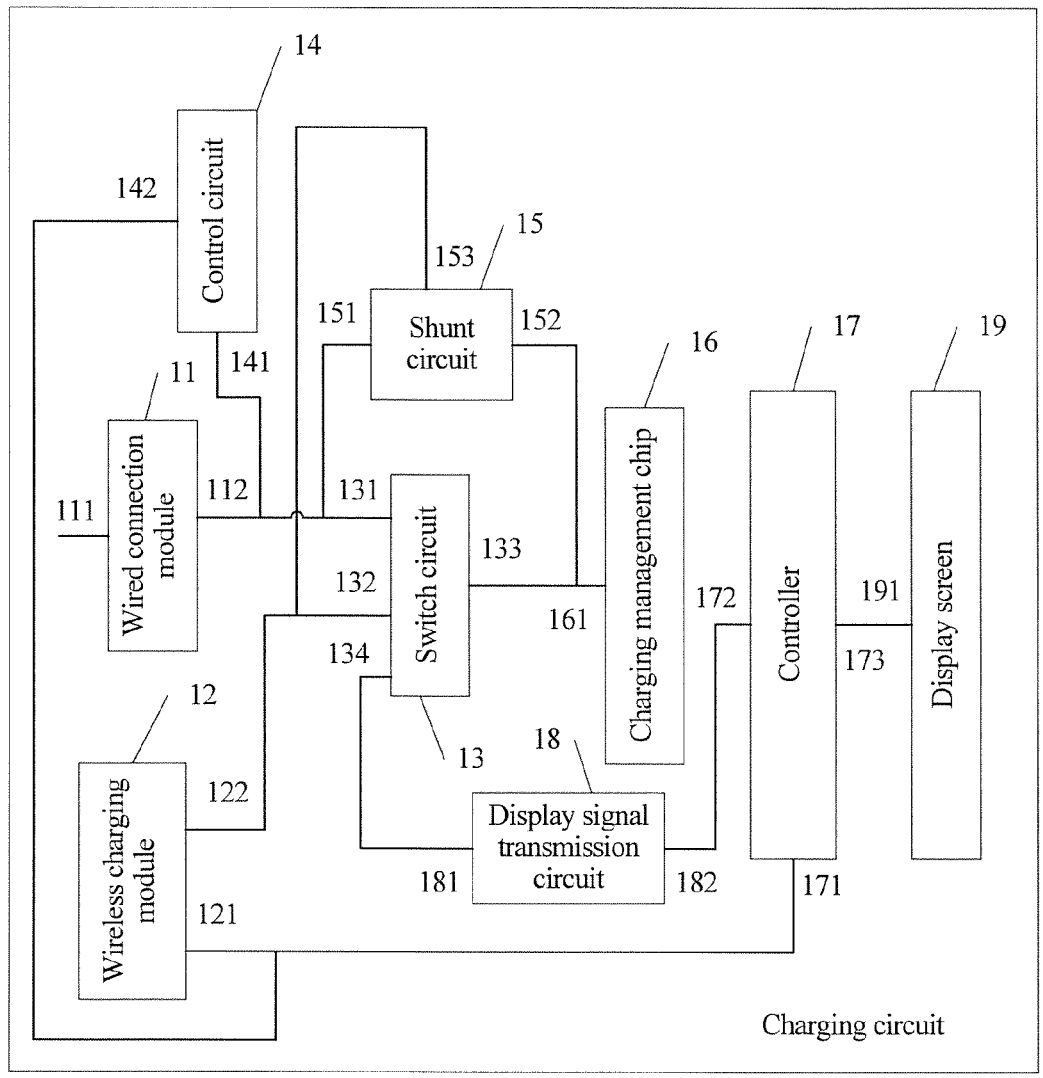
FIG. 5 is a schematic structural diagram of another charging circuit according to an embodiment of the present invention.

Optionally, as shown in FIG. 5, the circuit may further include: a display signal transmission circuit 18 and a display screen 19, where an input end 181 of the display signal transmission circuit 18 connects to a second output end 134 of the switch circuit 13, an output end 182 of the display signal transmission circuit 18 connects to a second input/output end 172 of the controller 17, and an input end 191 of the display screen 19 connects to a third input/output end 173 of the controller 17.

Optionally, the switch circuit 13 may further be configured to: when the switch circuit 13 receives the first charging signal, output a high level signal by using the second output end 134 of the switch circuit 13, so that the display signal transmission circuit 18 can be configured to: when receiving the high level signal output by the second output end 134 of the switch circuit 13, output a low level signal to the controller 17, so that the controller 17 can further be configured to output a first display instruction to the display screen 19 according to the low level signal transmitted by the display signal transmission circuit 18, and the display screen 19 can display a first display message according to the first display instruction, where the first display message may be used to indicate that wired charging is currently performed on the battery.

Optionally, the switch circuit 13 may further be configured to: when the switch circuit 13 receives the second charging signal, the second output end 134 of the switch circuit 13 outputs a low level signal, so that the display signal transmission circuit 18 can further be configured to: when receiving the low level signal output by the second output end 134 of the switch circuit 13, output a high level signal to the controller 17, so that the controller 17 can be configured to output a second display instruction to the display screen 19 according to the high level signal transmitted by the display signal transmission circuit 18, and the display screen 19 can display a second display message according to the second display instruction, where the second display message may be used to indicate that wireless charging is currently performed on the battery.

Optionally, the switch circuit 13 may further be configured to: when the switch circuit 13 receives the first charging signal, output a low level signal by using the second output end 134 of the switch circuit 13, so that the display signal transmission circuit 18 can be configured to: when receiving the low level signal output by the second output end 134 of the switch circuit 13, output a high level signal to the controller 17, so that the controller 17 can further be configured to output a first display instruction to the display screen 19 according to the high level signal transmitted by the display signal transmission circuit 18, and the display screen 19 can display a first display message according to the first display instruction, where the first display message may be used to indicate that wired charging is currently performed on the battery.

Optionally, the switch circuit 13 may further be configured to: when the switch circuit 13 receives the second charging signal, output a high level signal by using the second output end 134 of the switch circuit 13, so that the display signal transmission circuit 18 can further be configured to: when receiving the high level signal output by the second output end 134 of the switch circuit 13, output a low level signal to the controller 17, so that the controller 17 can be configured to output a second display instruction to the display screen 19 according to the low level signal transmitted by the display signal transmission circuit 18, and the display screen 19 can display a second display message according to the second display instruction, where the second display message may be used to indicate that wireless charging is currently performed on the battery.

In this implementation manner, it may be implemented that, when wired charging is performed, the display screen 19 outputs a first display message to indicate to a user that wired charging is currently performed on the battery; or, when wireless charging is performed, the display screen 19 outputs a second display message to indicate to a user that wireless charging is currently performed on the battery.

Optionally, the first display message and the second display message may implement respectively representing, by using different display colors, that wired charging or wireless charging is being performed on the battery. For example, when an indicator of the display screen displays red, it indicates the first display message, and when the indicator of the display screen displays green, it indicates the second display message. Alternatively, the first display message and the second display message may implement respectively representing, by using different display content, that wired charging or wireless charging is being performed on the battery. For example, a text that is of the first display message and displayed by the display screen is "wired charging", and a text that is of the second display message and displayed by the display screen is "wireless charging".

Optionally, referring to FIG. 6, the shunt circuit 15 includes: at least one group of P-type MOS transistors, where:

each group of P-type MOS transistors includes a first P-type MOS transistor T1 and a second P-type MOS transistor T2, where a drain electrode of the first P-type MOS transistor T1 connects to the second input/output end 112 of the wired connection module 11, a source electrode of the first P-type MOS transistor T1 connects to a source electrode of the second P-type MOS transistor T2, a drain electrode of the second P-type MOS transistor T2 connects to the input/output end 161 of the charging management module 16, a gate electrode of the first P-type MOS transistor T1 connects to a gate electrode of the second P-type MOS transistor T2, and the gate electrode of the first P-type MOS transistor T1 further connects to the output end 122 of the wireless charging module 12. That the gate electrode of the first P-type MOS transistor T1 further connects to the output end 122 of the wireless charging module 12 may be specifically that the gate electrode of the first P-type MOS transistor T1 connects to the output end 122 of the wireless charging module 12 by using the protection circuit 20.

The protection circuit 20 includes: a resistor R1, a resistor R2, and a capacitor C1, where the resistor R1 is serially connected between the gate electrode of the first P-type MOS transistor T1 and the output end 122 of the wireless charging module 12, the capacitor C1 is serially connected between the gate electrode of the first P-type MOS transistor T1 and ground, and the resistor R2 is serially connected between the output end 122 of the wireless charging module 12 and the ground.

In this implementation manner, when wired charging is performed, that is, when the second input/output end 112 of the wired connection module 11 outputs a first charging signal, the output end 122 of the wireless charging module 12 does not output a second charging signal, so that the drain electrode of the first P-type MOS transistor T1 receives the first charging signal output by the second input/output end 112 of the wired connection module 11, and the resistor R1 of the protection circuit 20 does not receive a second charging signal. Therefore, a level at a connection point of the resistor R1 and the gate electrode of the first P-type MOS transistor T1 is a low level, that is, a voltage of the drain electrode of the first P-type MOS transistor T1 is higher than a voltage of the gate electrode of the first P-type MOS transistor T1, so that the drain electrode of the first P-type MOS transistor T1 and the source electrode of the first P-type MOS transistor T1 are conducted. Therefore, the first charging signal is transmitted to the source electrode of the second P-type MOS transistor T2, and the gate electrode of the second P-type MOS transistor T2 connects to the gate electrode of the first P-type MOS transistor T1, that is, a level of the gate electrode of the second P-type MOS transistor T2 is equal to a level of the gate electrode of the first P-type MOS transistor T1, so that a voltage of the source electrode of the second P-type MOS transistor T2 is higher than a voltage of the gate electrode of the second P-type MOS transistor T2, and therefore, the drain electrode of the second P-type MOS transistor T2 and the source electrode of the second P-type MOS transistor T2 are conducted. In this way, the first charging signal is transmitted to the charging management module. In addition, when the wired connection module 11 connects to the external device, the controller 17 may output a high level signal to the enabling end 121 of the wireless charging module 12, and the output end 122 of the wireless charging module 12 does not output the second charging signal, so that when the terminal in which the charging circuit is located needs to supply power to the external device, the charging management module 16 can output a third electrical signal to the drain electrode of the second P-type MOS transistor T2, a voltage of the drain electrode of the second P-type MOS transistor T2 is higher than the voltage of the gate electrode of the second P-type MOS transistor T2, and therefore, the drain electrode of the second P-type MOS transistor T2 and the source electrode of the second P-type MOS transistor T2 are conducted. In this way, the third electrical signal is transmitted to the source electrode of the first P-type MOS transistor T1; because a voltage of the source electrode of the first P-type MOS transistor T1 is higher than the voltage of the gate electrode of the first P-type MOS transistor T1, the drain electrode of the first P-type MOS transistor and the source electrode of the first P-type MOS transistor are conducted. In this way, the third electrical signal is transmitted to the wired connection module 11, thereby implementing supplying power to the external device. In addition, because the source electrode of the first P-type MOS transistor T1 connects to the source electrode of the second P-type MOS transistor T2, a diode in the first P-type MOS transistor T1 and a diode in the second P-type MOS transistor T2 are connected reversely, which may avoid that when the first P-type MOS transistor T1 and the second P-type MOS transistor T2 are not conducted, a current flows from the charging management module 16 into the wired connection module 11, thereby avoiding a current backflow.

Optionally, the source electrode of the first P-type MOS transistor T1 may further connect to the second input/output end 112 of the wired connection module 11, the drain electrode of the first P-type MOS transistor T1 may further connect to the drain electrode of the second P-type MOS transistor T2, the source electrode of the second P-type MOS transistor T2 may further connect to the input/output end 161 of the charging management module 16, the gate electrode of the first P-type MOS transistor T1 may further connect to the gate electrode of the second P-type MOS transistor T2, and the gate electrode of the first P-type MOS transistor T1 may further connect to the output end 122 of the wireless charging module 12 by using the protection circuit.

A principle of this implementation manner is the same as a principle of the foregoing implementation manner in which the source electrode of the first P-type MOS transistor T1 connects to the source electrode of the second P-type MOS transistor T2, which may implement that the first charging signal is transmitted to the charging management module 16, a data signal is transmitted to the wired connection module 11, and a current backflow can be avoided.

In the foregoing two implementation manners, the shunt circuit 15 uses at least one group of P-type MOS transistors. An impedance of the MOS transistor may be extremely low, and therefore an impedance of the shunt circuit 15 is extremely low. The shunt circuit 15 and the switch circuit 13 are connected in parallel on a path between the wired connection module 11 and the charging management module 16, and therefore, an impedance on the path between the wired connection module 11 and the charging management module 16 is extremely low, which may implement that a voltage step-down of the first charging signal from the wired connection module 11 to the charging management module 16 is also extremely low, and implement that the wired charger can use a high current to charge the battery. In addition, as shown in FIG. 6, the shunt circuit 15 may further include at least another group of P-type MOS transistors that include a third P-type MOS transistor T3 and a fourth P-type MOS transistor T4.

Optionally, as shown in FIG. 6, the switch circuit 13 may be a dual-input switch, for example, a load switch (load switch).

Optionally, as shown in FIG. 6, the control circuit 14 may include: a resistor R3, a resistor R4, a resistor R5, and a first N-type MOS transistor T5, where:

one end of the resistor R3 connects to the second input/output end 112 of the wired connection module 11, and the other end of the resistor R3 separately connects to a gate electrode of the first N-type MOS transistor and one end of the resistor R4; the one end of the resistor R4 connects to the gate electrode of the first N-type MOS transistor, and the other end of the resistor R4 is grounded; and a drain electrode of the first N-type MOS transistor is configured to connect to a stable potential, a source electrode of the first N-type MOS transistor T5 connects to the enabling end 121 of the wireless charging module 12, and the source electrode of the first N-type MOS transistor T5 is further grounded by using the resistor R5.

Optionally, a voltage of the stable potential may be lower than a voltage of the first charging signal. The stable potential may be a port that can provide a stable potential and is in the terminal to which the charging circuit belongs, for example, a port that provides 1.8 V.

In this implementation manner, when the second input/output end 112 of the wired connection module 11 outputs a first charging signal, because a voltage of the first charging signal is higher than a voltage of the stable potential, the source electrode of the first N-type MOS transistor T5 and the drain electrode of the first N-type MOS transistor T5 are conducted, so that the drain electrode of the first N-type MOS transistor T5 outputs a stable voltage signal, provided by the stable potential, to the enabling end of the wireless charging module 12. Because the stable voltage signal is a high level signal, the wireless charging module 12 forbids the output end 122 to output a signal, so as to implement that only the first charging signal charges the battery.

Optionally, as shown in FIG. 6, the display signal transmission circuit 18 includes: a resistor R6, a resistor R7, and a second N-type MOS transistor T6, where:

a gate electrode of the second N-type MOS transistor T6 connects to the second output end 134 of the switch circuit 13, the gate electrode of the second N-type MOS transistor T6 is further grounded by using the resistor R7, a drain electrode of the second N-type MOS transistor T6 connects to the second input/output end 172 of the controller 17, the drain electrode of the second N-type MOS transistor further connects to a stable potential by using the resistor R6, and a source electrode of the second N-type MOS transistor T6 is grounded.

Optionally, a stable potential used by the resistor R6 to connect to the stable potential may be a same power supply or a same port that the drain electrode of the first N-type MOS transistor T5 uses to connect to the stable potential in the foregoing implementation manner.

In this implementation manner, when the switch circuit 13 receives the first charging signal, the second output end 134 of the switch circuit 13 outputs a high level signal, that is, the gate electrode of the second N-type MOS transistor receives the high level signal; in addition, a signal received by the drain electrode of the second N-type MOS transistor T6 is a signal obtained after the resistor R6 performs voltage step-down on a stable potential signal. Therefore, the source electrode of the second N-type MOS transistor T6 and the drain electrode of the second N-type MOS transistor T6 are conducted, so that the drain electrode of the second N-type MOS transistor is grounded, that is, the drain electrode of the second N-type MOS transistor T6 outputs a low level signal. That is, the drain electrode of the second N-type MOS transistor outputs a low level signal to the controller 17, the controller 17 then transmits a first display instruction to the display screen 19, and the display screen 19 then displays a first display message. In this way, it can be indicated, by using the display screen 19 to display the first display message, that a wired charger is charging the battery. When the switch circuit 13 receives the second charging signal, the second output end 134 of the switch circuit 13 outputs a low level signal, that is, the gate electrode of the second N-type MOS transistor T6 receives the low level signal; in addition, a signal received by the drain electrode of the second N-type MOS transistor T6 is a signal obtained after the resistor R6 performs voltage step-down on a stable potential signal. Therefore, the source electrode of the second N-type MOS transistor and the drain electrode of the second N-type MOS transistor T6 are not conducted, and the drain electrode of the second N-type MOS transistor T6 outputs a high level signal. That is, the drain electrode of the second N-type MOS transistor T6 outputs a high level signal to the controller, the controller 17 then transmits a second display instruction to the display screen 19, and the display screen 19 then displays a second display message. In this way, it can be indicated, by using the display screen 19 to display the second display message, that a wireless charger is charging the battery.

Optionally, as shown in FIG. 6, the charging circuit may further include: a first electrostatic protection circuit 21, where the first electrostatic protection circuit 21 includes: a capacitor C2, a capacitor C3, and an electrostatic protection diode D1, where:

one end of the capacitor C2 connects to the output end 122 of the wireless charging module 12, and the other end of the capacitor C2 is grounded; one end of the capacitor C3 connects to the output end 122 of the wireless charging module 12, and the other end of the capacitor C3 is grounded; and one end of the electrostatic protection diode D1 connects to the output end 122 of the wireless charging module 12, and the other end of the electrostatic protection diode D1 is grounded. In addition, the output end 122 of the wireless charging module 12 may further connect to the second input end 132 of the switch circuit.

This implementation manner may implement electrostatic protection for the output end 122 of the wireless charging module 12, so as to prevent static electricity from damaging the wireless charging module.

Optionally, as shown in FIG. 6, the charging circuit may further include: a second electrostatic protection circuit 22, where the second electrostatic protection circuit 22 includes: an electrostatic protection diode D2, where:

one end of the electrostatic protection diode D2 connects to the enabling end 121 of the wireless charging module 12 and the first input/output end 171 of the controller 17, and the other end of the electrostatic protection diode D2 is grounded.

This implementation manner may implement electrostatic protection for the enabling end 121 of the wireless charging module 12, so as to prevent static electricity from damaging the wireless charging module.

Optionally, as shown in FIG. 6, the wired connection module 11 further includes a ground end 113, where the ground end 113 is grounded, and the wireless charging module 12 further includes a ground end 123, where the ground end 123 is grounded.

In addition, an embodiment of the present invention further provides a terminal, where the terminal may include any charging circuit provided in the embodiment of the present invention, which is not described herein again.

In the foregoing technical solutions, a first input/output end of a wired connection module is configured to connect to an output end of a wired charger, a second input/output end of the wired connection module connects to a first input end of a switch circuit, and the second input/output end further connects to a first input/output end of a shunt circuit; a first input end of a control circuit connects to the second input/output end of the wired connection module, and an output end of the control circuit connects to an enabling end of a wireless charging module; an output end of the wireless charging module connects to a second input end of the switch circuit; a first output end of the switch circuit connects to an input/output end of a charging management module; a second input/output end of the shunt circuit connects to the input/output end of the charging management module, and a third end of the shunt circuit connects to the output end of the wireless charging module; and an output end of the charging management module is configured to connect to a battery. In this way, the foregoing circuit can implement wired charging and wireless charging for a terminal battery, thereby resolving a problem about how to integrate wired charging technologies and wireless charging technologies on a terminal.

What is disclosed above is merely exemplary embodiments of the present invention, and certainly is not intended to limit the protection scope of the present invention. Therefore, equivalent variations made in accordance with the claims of the present invention shall fall within the scope of the present invention.

What is claimed is:

1. A charging circuit, comprising:
a wired connection module, a wireless charging module, a switch circuit, a control circuit, a shunt circuit, and a charging management module, wherein:
a first input/output end of the wired connection module is configured to connect to an output end of a wired charger, a second input/output end of the wired connection module connects to a first input end of the switch circuit, and the second input/output end further connects to a first input/output end of the shunt circuit;
a first input end of the control circuit connects to the second input/output end of the wired connection module, and an output end of the control circuit connects to an enabling end of the wireless charging module;
an output end of the wireless charging module connects to a second input end of the switch circuit;
a first output end of the switch circuit connects to an input/output end of the charging management module;
a second input/output end of the shunt circuit connects to the input/output end of the charging management module, and a third end of the shunt circuit connects to the output end of the wireless charging module; and
an output end of the charging management module is configured to connect to a battery.

2. The circuit according to claim 1, wherein the wired connection module is configured to receive a first charging signal output by the wired charger, wherein the first charging signal charges the battery after passing through the second input/output end of the wired connection module, the first input end of the switch circuit, the first output end of the switch circuit, an input end of the charging management module, and the output end of the charging management module; when the third end of the shunt circuit does not receive a second charging signal output by the output end of the wireless charging module, the first input/output end of the shunt circuit and the second input/output end of the shunt circuit are conducted, so that the first charging signal charges the battery after passing through the second input/output end of the wired connection module, the first input/output end of the shunt circuit, the second input/output end of the shunt circuit, the input end of the charging management module, and the output end of the charging management module; and the first charging signal is further transmitted to the first input end of the control circuit by using the second input/output end of the wired connection module, and when the first input end of the control circuit receives the first charging signal, the output end of the control circuit outputs a high level signal, the high level signal is transmitted to the enabling end of the wireless charging module, the enabling end of the wireless charging module receives the high level signal, and the output end of the wireless charging module does not output a signal.

3. The circuit according to claim 1, wherein the third end of the shunt circuit connects to the output end of the wireless charging module by using a protection circuit.

4. The circuit according to claim 3, wherein the shunt circuit comprises: at least one group of P-type MOS transistors, wherein:
each group of P-type MOS transistors comprises a first P-type MOS transistor and a second P-type MOS transistor, wherein a drain electrode of the first P-type MOS transistor connects to the second input/output end of the wired connection module, a source electrode of the first P-type MOS transistor connects to a source electrode of the second P-type MOS transistor, a drain electrode of the second P-type MOS transistor connects to the input/output end of the charging management module, a gate electrode of the first P-type MOS transistor connects to a gate electrode of the second P-type MOS transistor, and the gate electrode of the first P-type MOS transistor connects to the output end of the wireless charging module by using the protection circuit.

5. The circuit according to claim 1, wherein the control circuit comprises: a resistor R3, a resistor R4, a resistor R5, and a first N-type MOS transistor, wherein:
one end of the resistor R3 connects to the second input/output end of the wired connection module, and the other end of the resistor R3 connects to a gate electrode of the first N-type MOS transistor and one end of the resistor R4; the one end of the resistor R4 connects to the gate electrode of the first N-type MOS transistor, and the other end of the resistor R4 is grounded; and a drain electrode of the first N-type MOS transistor is configured to connect to a stable potential, a source electrode of the first N-type MOS transistor connects to the enabling end of the wireless charging module, and the source electrode of the first N-type MOS transistor is further grounded by using the resistor R5.

6. The circuit according to claim 2, wherein the circuit further comprises a controller, and the enabling end of the wireless charging module further connects to a first input/output end of the controller;
the first input/output end of the wired connection module is further configured to connect to an external device;
the controller is configured to: when the first input/output end of the wired connection module connects to the external device, output a high level signal to the enabling end of the wireless charging module, wherein the output end of the wireless charging module does not output a signal when the enabling end of the wireless charging module receives the high level signal; and
the controller is further configured to control the charging management module, wherein a current output by the charging management module supplies power to the external device after passing through the second input/output end of the shunt circuit, the first input/output end of the shunt circuit, the second input/output end of the wired connection module, and the first input/output end of the wired connection module.

7. The circuit according to claim 6, wherein the circuit further comprises a display signal transmission circuit and a display screen, wherein an input end of the display signal transmission circuit connects to a second output end of the switch circuit, an output end of the display signal transmission circuit connects to a second input/output end of the controller, and an input end of the display screen connects to a third input/output end of the controller, wherein:
the switch circuit is further configured to: when the switch circuit receives the first charging signal, output a high level signal by using the second output end of the switch circuit, when the input end of the display signal transmission circuit receives the high level signal, the display signal transmission circuit outputs a low level signal to the controller, the controller is further configured to output a first display instruction to the display screen according to the low level signal transmitted by the display signal transmission circuit, and the display screen is configured to display a first display message according to the first display instruction, wherein the first display message is used to indicate that wired charging is currently performed on the battery; and
the switch circuit is further configured to: when the switch circuit receives the second charging signal, output a low level signal by using the second output end of the switch circuit, when the input end of the display signal transmission circuit receives the low level signal, the display signal transmission circuit outputs a high level signal to the controller, the controller is further configured to output a second display instruction to the display screen according to the high level signal transmitted by the display signal transmission circuit, and the display screen is configured to display a second display message according to the second display instruction, wherein the second display message is used to indicate that wireless charging is currently performed on the battery.

8. The circuit according to claim 4, wherein:
the protection circuit comprises: a resistor R1, a resistor R2, and a capacitor C1, wherein the resistor R1 is serially connected between the gate electrode of the first P-type MOS transistor and the output end of the wireless charging module, the capacitor C1 is serially connected between the gate electrode of the first P-type MOS transistor and ground, and the resistor R2 is serially connected between the output end of the wireless charging module and the ground.

9. The circuit according to claim 7, wherein the display signal transmission circuit comprises: a resistor R6, a resistor R7, and a second N-type MOS transistor, wherein:
a gate electrode of the second N-type MOS transistor connects to the second output end of the switch circuit, the gate electrode of the second N-type MOS transistor is further grounded by using the resistor R7, a drain electrode of the second N-type MOS transistor connects to the second input/output end of the controller, the drain electrode of the second N-type MOS transistor further connects to a stable potential by using the resistor R6, and a source electrode of the second N-type MOS transistor is grounded.

10. The circuit according to claim 1, wherein the circuit further comprises: a first electrostatic protection circuit comprising: a capacitor C2, a capacitor C3, and an electrostatic protection diode D1, wherein:
one end of the capacitor C2 connects to the output end of the wireless charging module, and the other end of the capacitor C2 is grounded; one end of the capacitor C3 connects to the output end of the wireless charging module, and the other end of the capacitor C3 is grounded; and one end of the electrostatic protection diode D1 connects to the output end of the wireless charging module, and the other end of the electrostatic protection diode D1 is grounded.

11. The circuit according to claim 1, wherein the circuit further comprises: a second electrostatic protection circuit comprising: an electrostatic protection diode D2, wherein:
one end of the electrostatic protection diode D2 connects to the enabling end of the wireless charging module and the first input/output end of the controller, and the other end of the electrostatic protection diode D2 is grounded.

12. The circuit according to claim 2, wherein the wireless charging module is configured to receive a second charging signal output by a wireless charger, wherein the enabling end of the wireless charging module receives a low level signal, and the second charging signal charges the battery after passing through the output end of the wireless charging module, the second input end of the switch circuit, the first output end of the switch circuit, an input end of the charging management module, and the output end of the charging management module.

13. The circuit according to claim 6, wherein the switch circuit is further configured to: when the switch circuit receives the first charging signal, output a low level signal by using the second output end of the switch circuit, when the input end of the display signal transmission circuit receives the low level signal, the display signal transmission circuit outputs a high level signal to the controller, the controller is further configured to output a first display instruction to the display screen according to the high level signal transmitted by the display signal transmission circuit, and the display screen is configured to display a first display message according to the first display instruction, wherein the first display message is used to indicate that wired charging is currently performed on the battery; and the switch circuit is further configured to: when the switch circuit receives the second charging signal, output a high level signal by using the second output end of the switch circuit, when the input end of the display signal transmission circuit receives the high level signal, the display signal transmission circuit outputs a low level signal to the controller, the controller is further configured to output a second display instruction to the display screen according to the low level signal transmitted by the display signal transmission circuit, and the display screen is configured to display a second display message according to the second display instruction, wherein the second display message is used to indicate that wireless charging is currently performed on the battery.

14. The terminal comprising:
a charging circuit comprising a wired connection module, a wireless charging module, a switch circuit, a control circuit, a shunt circuit, and a charging management module, wherein:
a first input/output end of the wired connection module is configured to connect to an output end of a wired charger, a second input/output end of the wired connection module connects to a first input end of the switch circuit, and the second input/output end further connects to a first input/output end of the shunt circuit;
a first input end of the control circuit connects to the second input/output end of the wired connection module, and an output end of the control circuit connects to an enabling end of the wireless charging module;
an output end of the wireless charging module connects to a second input end of the switch circuit;
a first output end of the switch circuit connects to an input/output end of the charging management module;
a second input/output end of the shunt circuit connects to the input/output end of the charging management module, and a third end of the shunt circuit connects to the output end of the wireless charging module; and
an output end of the charging management module is configured to connect to a battery.

15. The terminal according to claim 14, wherein the wired connection module is configured to receive a first charging signal output by the wired charger, wherein the first charging signal charges the battery after passing through the second input/output end of the wired connection module, the first input end of the switch circuit, the first output end of the switch circuit, an input end of the charging management module, and the output end of the charging management module; when the third end of the shunt circuit does not receive a second charging signal output by the output end of the wireless charging module, the first input/output end of the shunt circuit and the second input/output end of the shunt circuit are conducted, so that the first charging signal charges the battery after passing through the second input/output end of the wired connection module, the first input/output end of the shunt circuit, the second input/output end of the shunt circuit, the input end of the charging management module, and the output end of the charging management module; and the first charging signal is further transmitted to the first input end of the control circuit by using the second input/output end of the wired connection module, and when the first input end of the control circuit receives the first charging signal, the output end of the control circuit outputs a high level signal, the high level signal is transmitted to the enabling end of the wireless charging module, the enabling end of the wireless charging module receives the high level signal, and the output end of the wireless charging module does not output a signal.

16. The terminal according to claim 15, wherein the wireless charging module is configured to receive a second charging signal output by a wireless charger, wherein the enabling end of the wireless charging module receives a low level signal, and the second charging signal charges the battery after passing through the output end of the wireless charging module, the second input end of the switch circuit, the first output end of the switch circuit, an input end of the charging management module, and the output end of the charging management module.

17. The terminal according to claim 14, wherein the third end of the shunt circuit connects to the output end of the wireless charging module by using a protection circuit.

18. The terminal according to claim 14, wherein the control circuit comprises: a resistor R3, a resistor R4, a resistor R5, and a first N-type MOS transistor, wherein:
one end of the resistor R3 connects to the second input/output end of the wired connection module, and the other end of the resistor R3 connects to a gate electrode of the first N-type MOS transistor and one end of the resistor R4; the one end of the resistor R4 connects to the gate electrode of the first N-type MOS transistor, and the other end of the resistor R4 is grounded; and a drain electrode of the first N-type MOS transistor is configured to connect to a stable potential, a source electrode of the first N-type MOS transistor connects to the enabling end of the wireless charging module, and the source electrode of the first N-type MOS transistor is further grounded by using the resistor R5.

19. The terminal according to claim 14, wherein the circuit further comprises: a second electrostatic protection circuit, wherein the second electrostatic protection circuit comprises: an electrostatic protection diode D2, wherein:
one end of the electrostatic protection diode D2 connects to the enabling end of the wireless charging module and the first input/output end of the controller, and the other end of the electrostatic protection diode D2 is grounded.

* * * * *